United States Patent [19]

May et al.

[11] Patent Number: 5,729,166
[45] Date of Patent: Mar. 17, 1998

[54] DIGITALLY IMPLEMENTED FREQUENCY MULTIPLICATION CIRCUIT HAVING ADJUSTABLE MULTIPLICATION RATIO AND METHOD OF OPERATION

[75] Inventors: Michael R. May, Austin; Michael D. Cave, Pflugerville, both of Tex.

[73] Assignee: Motorola, Inc., Schaumburg, Ill.

[21] Appl. No.: 660,779

[22] Filed: Jun. 10, 1996

[51] Int. Cl.$^6$ ............................................. H03K 3/72
[52] U.S. Cl. ........................... 327/116; 327/119; 327/120; 377/47
[58] Field of Search ..................... 327/113, 114, 327/116, 119–122, 356; 377/47, 48

[56] References Cited

FOREIGN PATENT DOCUMENTS

| 60-187123 | 9/1985 | Japan | 327/114 |
| 5-218821 | 8/1993 | Japan | 327/116 |

OTHER PUBLICATIONS

"Clock Speed Doubler with microprocessor Application", IBM Technical Disclosure Bulletin, vol. 37, No. 7, Jul. 1994.

*Primary Examiner*—Toan Tran
*Assistant Examiner*—T. T. Lam

[57] ABSTRACT

A frequency multiplication circuit (10) includes a periodic interval selector (12) and a delay element (28) to produce an output signal (26) in phase with, and at a frequency multiple of a reference signal (18). During a first time interval, the periodic interval selector (12) bases the output signal (26) on the reference signal (18). During a second time interval, the periodic interval selector (12) bases the output signal (26) on a delayed signal (22) produced by the delay element (14) based upon the output signal (26). Feedback from the output of the periodic interval selector (12) through the delay element (14) and the operation of the periodic interval selector (12) causes the output signal (26) to be in phase with, and at a frequency multiple of the reference signal (18). Delay adjuster (52) adjusts delay produced by the delay element (14) to adjust the output signal (26) to cause the output signal (26) to have a desired duty cycle consistency. Periodic interval selector (12) and delay adjuster (52) may be adjusted as well as to adjust a frequency multiplication ratio of the frequency multiplication circuit (10). Delay element (14) may be implemented with digital circuit elements such as inverters, other logic gates, or individual circuit elements operably coupled to produce a controllable variable delay.

17 Claims, 6 Drawing Sheets

DIGITALLY IMPLEMENTED FREQUENCY MULTIPLICATION CIRCUIT HAVING ADJUSTABLE MULTIPLICATION RATIO AND METHOD OF OPERATION

FIELD OF THE INVENTION

This invention relates generally to frequency multiplication circuits and more particularly to a digitally implemented frequency multiplication circuit having control circuitry to lock the phase of a multiplied frequency output with respect to a reference signal input.

BACKGROUND OF THE INVENTION

Phase locked loop circuits (PLLs) and various other circuits employ frequency multiplication circuits to provide an output signal having a frequency that is a multiple of the frequency of an input or reference signal. Particular uses of this frequency multiplied output signal relate to the clocking of digital circuits that must be synchronized to the reference signal, latching data arriving at the output signal frequency, and various other applications wherein an output signal must be at a multiple frequency of the reference signal but in a phase locked condition.

Traditional PLLs have various problems. One particular problem relates to noise on the output signal. Because traditional PLLs used analog circuits to produce the output signal at the multiple frequency, the analog circuits themselves produced noise in the output signal. Defects in analog components, inconsistencies between theoretically identical components and factors relating to signal squaring and comparing among other factors produced noise in the output signal. The noise produced in the output signal often disturbed the operation of connected digital circuits that used the output signal as a clock signal. Noise in the output signal also often caused the PLLs to lose their lock with the reference signal. When lock was lost, operations that were being performed using the output signal oftentimes failed. Noise also caused the frequency of the output signal to drift with respect to the reference signal, perhaps causing data sampling performed by an associated circuit to sample on the wrong bit. Miss-sampling of data reduces system efficiency and accuracy.

Another problem with traditional PLLs relates to process variations in the construction of the PLLs. Small process variations often greatly altered the operating characteristics of the PLLs such that the duty cycle of the output signal would be problematic. Process variations often caused PLL component mismatches, circuit time constants to vary, and circuit components to behave other than expected. Thus, with prior PLL circuits, the process used to manufacture the PLLs had to be very tightly controlled in order to facilitate the correct operation of the PLLs. In order to minimize variations in manufacturing processes, an additional polysilicon layer was often added in which device parameter sensitive components were formed. By adding the additional polysilicon layer, the cost of the process to manufacture the integrated circuits increased while yields decreased due to added complexity.

Traditional PLL circuits often required external capacitors in order to function properly. The external capacitors required additional external signal lines that added to the cost of the circuits. Further, the addition of the external capacitors caused board integration problems due to placement requirements of the external capacitors.

Another limitation of the prior art frequency multiplication circuits is related to design costs. Because the design of a mixed analog and digital circuit is more difficult than the design of a solely digital circuit, prior art design costs were greater.

Thus, there is a need in the art for an improved frequency multiplication circuit that overcomes the limitations of the prior devices to provide a multiplied frequency output based upon a reference signal input.

DESCRIPTION OF A PREFERRED EMBODIMENT

The present invention provides a digital frequency multiplication circuit capable of receiving a reference signal and, based upon the reference signal, providing an output signal that is at a frequency multiple of the reference signal and substantially in phase with the reference signal. The frequency multiplication circuit comprises a periodic interval selector and a delay element. The periodic interval selector receives the reference signal as one input and a delayed signal as a second input. During a first period of operation, the periodic interval selector provides a representation of the reference signal as its output. During a second interval of operation, the periodic interval selector provides a representation of the delayed signal as the output signal. Thus, with the first interval of operation and second interval of operation comprising all time periods, the periodic interval selector continuously produces an output signal.

The delay element receives the output signal and provides a delayed representation of the output signal as a delayed signal. In an embodiment of the present invention, the delayed signal has a frequency that is at a multiple of a frequency of the reference signal due to the operation of the periodic interval selector and the delay element in conjunction with one another. Thus, based upon the particular design of the digital frequency multiplier or multiplication circuit, the output signal is at a frequency multiple of the reference signal and substantially in phase with the reference signal. The adjustments provided in accordance with the circuit causes the output signal to be both in phase with the reference signal and to have a substantially uniform duty cycle. Thus, the frequency multiplication circuit of the present invention provides a digital implementation of a frequency multiplier that overcomes the disadvantages of the prior art devices.

Figure 1:
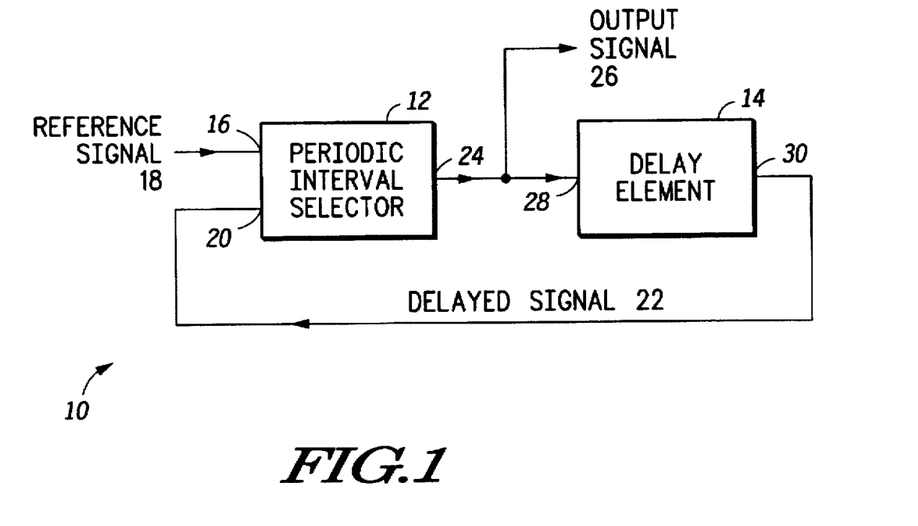
FIG. 1 illustrates, in block diagram form, a digital frequency multiplier in accordance with one embodiment of the present invention.

FIG. 1 illustrates a digital frequency multiplier 10 comprising a periodic interval selector 12 and a delay element 14 in accordance with the present invention. The periodic interval selector 12 has a reference signal input 16, a delayed signal input 20 and a periodic interval selector output 24. A reference signal 18 is provided to the reference signal input 16 of the period interval selector 12. Provided at the periodic interval selector output 24 is the output signal 26.

Contained within the periodic interval selector 12 are circuits for producing the output signal 26 in a manner so that the output signal 26 is based upon the reference signal input 16 during a first time interval and is based upon the delayed signal input 20 during a second time interval. The delay element 14 has an input 28 that is connected to the periodic interval selector output 24 and a delayed signal output 30 that is connected to the delayed signal input 20 of the periodic interval selector 12. Delay element 14 produces the delayed signal 22 that is a delayed representation of the output signal 26 produced at the periodic interval selector output 24.

In one embodiment of the present invention, the first interval encompasses periods of time surrounding rising edges of the reference signal 18 while the second interval comprises all remaining intervals of time. The delayed signal 22 is at a frequency multiple of the reference signal 18 due to feedback through the periodic interval selector 12 and delay element 14. The feedback producing such phenomena will be discussed later. The operation of the periodic interval selector 12 and the delay element 14 may be modified and adjusted in another embodiment of the present invention so that the output signal 26 may be produced at various frequency multiples of the reference signal 18.

Thus, the digital frequency multiplier 10 of FIG. 1 performs a frequency multiplication function with only digital components in contrast to the combination of analog and digital components of the prior devices. In this fashion, the present invention reduces costs associated with the design and production of the digital frequency multiplier as compared to the prior art PLL circuits. Because the digital frequency multiplier 10 produces a frequency multiplied output signal using only digital circuit components, noise in the output signal 26 is substantially reduced as compared to the signals produced by the prior art PLLs. Thus, the frequency multiplier of the present invention causes coupled digital signal processors or data sampling circuits to operate with fewer difficulties.

Figure 2:
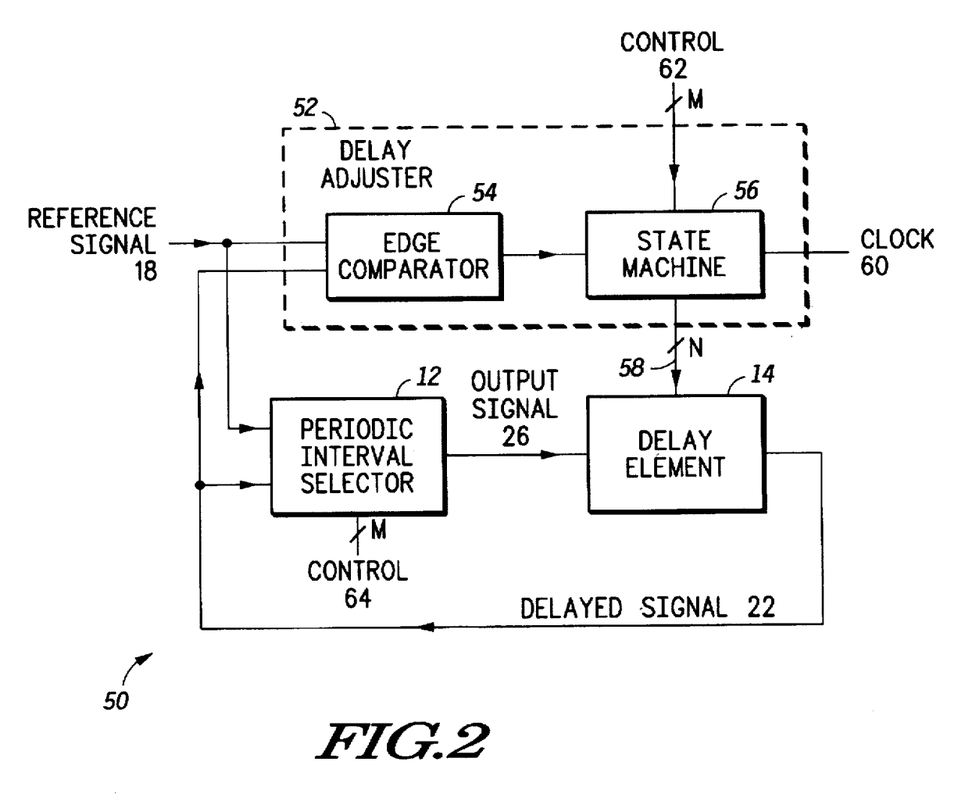
FIG. 2 illustrates, in block diagram form, another embodiment of a digital frequency multiplier in accordance with the present invention.

FIG. 2 illustrates an alternative embodiment of the present invention implemented as a phase locked frequency multiplier circuit 50 comprising a periodic interval selector 12, a delay element 14, and a delay adjuster 52. The periodic interval selector 12 receives a reference signal 18 and a delayed signal 22. The periodic interval selector 12 produces an output signal 26 based upon the reference signal 18 during a first time interval and based upon the delayed signal 22 during a second time interval. Delay element 14 operably couples to the periodic interval selector 12 and receives output signal 26 from the periodic interval selector 12. The delay element produces the delayed signal 22 based upon the output signal 26 wherein the delayed signal 22 is a delayed representation of the output signal 26.

The delay adjuster 52 comprises an edge comparator 54 and a state machine 56 in the embodiment illustrated in FIG. 2. In other embodiments, however, the delay adjuster 52 comprises other components that accomplish an equivalent function to those components illustrated. The delay adjuster 52 operably couples to the delay element 14 and receives the reference signal 18 and the delayed signal 22. The delay adjuster adjusts a delay of the delay element 14 based upon the reference signal 18 and the delayed signal 22 to cause the output signal 26 to have a frequency at a multiple of the reference signal 18, to cause the output signal 26 to have a uniform duty cycle, and to cause the output signal 26 to be in phase with the reference signal 18.

The delay adjuster 52 also adjusts the delay of the delay element 14 to facilitate a particular frequency multiplier ratio of the phase locked frequency multiplier 50. Typical multiplier ratios may comprise one times, two times, three times, four times and so on depending on the particular application. Control signal 62 received by the delay adjuster 52 and control signal 64 received by the periodic interval selector 12 enable the operation of the phase locked frequency multiplier circuit at any of a plurality of multiplication ratios. Control signal 62 and control signal 64 have widths of M bits, where M is any integer value, to allow sufficient control of the delay adjuster 52 and the periodic interval selector 12 for the desired mode of operation. However, in other embodiments, control signals 62 and 64 may have different widths relative to each other. A host processor typically provides the control signals 62 and 64. However, in other embodiments, control circuitry is separately provided.

In one embodiment of the delay adjuster 52, the edge comparator 54 receives the reference signal 18 and the delayed signal 22. Based upon which of the signals arrives first, the edge comparator 54 provides a particular output to the state machine 56. The state machine 56 receives the output from the edge comparator 54 and, based upon the output, may transition to another state. The output of the state machine 56 connects to the delay element 14 via a control line 58 that has a width of N, where N is an integer value. The output of the state machine 56 controls the magnitude of the delay produced by the delay element 14 in providing the delayed signal 22 based on the output signal 26.

In one embodiment of the present invention, control signals 62 and 64 establish the frequency multiple produced by the frequency multiplier circuit 50. In such a situation, control signal 64 provided to the periodic interval selector 12 enables the operation of the periodic interval selector 12 during the first and second intervals based upon a desired frequency multiple. Control signal 62 provided to the delay adjuster 52 produces a particular delay required for the expected frequency of the reference signal as well as the desired frequency multiple. The edge comparator 54 then operates based upon the reference signal and the delayed signal 22 to adjust the state machine 56 to cause the delayed signal 22 to be in phase with the reference signal 18 at the desired multiple frequency of operation.

In other embodiments, the delay adjuster 52 has additional functionality relating to tracking variations and drift in the reference signal 18 and adjusting delay based upon such variations and drift. In still other embodiments, the delay adjuster 52 operates to adjust the delay for drifts in component values within the delay element 14 that may be caused by variations in temperature during operation. In various processes used to manufacture the frequency multiplier circuit 50, the inherent delay of the delay elements 14 may vary from wafer to wafer. Delay adjuster 52 operates to compensate for the variations by adjusting its output.

In another embodiment of the phase locked frequency multiplier circuit 50 of FIG. 2, a counter replaces the state machine 56 and has an output that provides input to the delay element 14. In the embodiment, the edge comparator 54 provides an input to the counter and the edge comparator 54 receives a clock signal. The clock signal is generated from the reference signal 18. In one embodiment, the clock signal is produced every other receipt of the reference signal. However, in other situations, the clock signal is produced at greater multiples of the reference signal 18. In a situation wherein the magnitude of delay provided by delay elements was too long, reference signal 18 would arrive before delayed signal 22. In that situation the edge comparator 54 provides a count-down signal to the counter. However, when the delayed signal 22 arrives prior to the reference signal 18 of the edge comparator 54, the delay is too small and the edge comparator 54 provides a count-up signal to the counter. The output of the counter is used directly by the delay element 14 to determine the magnitude of the delay produced by delay element 14. In another embodiment of the present invention, the output of the counter is decoded prior to receipt by the delay element 14. Because the delay adjuster 52 may serve both to alter the frequency multiplying characteristics of the frequency multiplier circuit as well as to provide fine adjustments to the output signal 26, large variations in delay must be represented by the counter. In this fashion, significant digits of the N-bit wide output provided by the counter may have significance differing from that of standard binary numbers. A decode circuit associated with the counter may be customized in order to provide a particular delay magnitude characteristic customized for particular applications. By using customized decode circuitry, large variations in delay magnitude caused by a single adjustment in the output of the counter may be avoided.

Thus, the phase locked frequency multiplier circuit 50 of FIG. 2 provides the important benefits of digital enablement that reduces and or eliminates the problems associated with the mixed analog and digital circuit. Further, the frequency multiplier 50 provides the important benefit of having an adjustable mode of operation as well as an automatic mechanism for providing an in phase multiple frequency output signal 26 based upon a reference signal 18. Thus, the benefits provided by the multiplier circuit 50 as compared to the prior devices cause the multiplier circuit 50 to provide superior and enhanced operation at a reduced cost of both manufacture and design. Further, since the phase locked frequency multiplier circuit 50 is implemented digitally, there is a reduction in energy consumption during the operation of the circuit 50.

Figure 3:
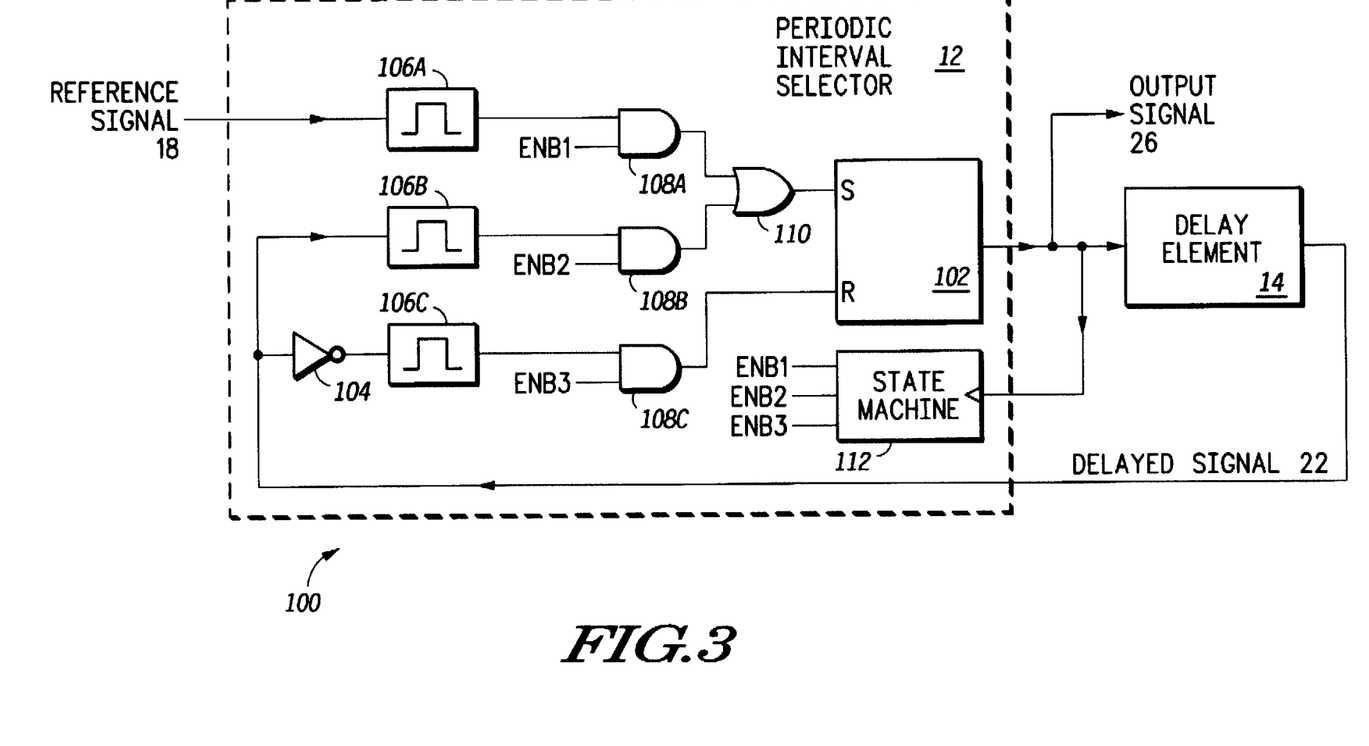
FIG. 3 illustrates, in partial block form and schematic diagram form, more detail of the periodic interval selector in the frequency multiplier of FIG. 1.

FIG. 3 illustrates an embodiment 100 showing in detail an embodiment of a periodic interval selector 12 of the present invention. In the embodiment, the periodic interval selector 12 comprises a set/reset (SR) flip-flop 102, an inverter 104, one shots 106A, 106B, 106C, AND-gate 108A through 108C, OR-gate 110 and state machine 112. In conjunction with the delay element 14, the periodic interval selector 12 provides the feedback that causes the phase locked frequency multiplier circuits to provide the output signal 26 at a frequency multiple of the reference signal 18.

During the first time interval, state machine 112 causes signal ENB1 applied to a first input of AND-gate 108A to be logic high while signals ENB2 and ENB3 are logic low. Thus, upon receipt of low to high transition of reference signal 18, one shot 106A provides a pulse to AND-gate 108A. The output of AND-gate 108A goes logic high driving the output of OR-gate 110 to a logic high value thus causing the SR flip-flop 102 to be set. When the SR flip-flop 102 is set, the output signal 26 goes to a logic high level. Thus, the output signal 26 will be held at a logic high level until the SR flip-flop 102 is reset. Output signal 26 clocks state machine 112 at each transition of output signal 26. Thus, at the transition of output signal 26 from logic low to logic high, the state machine 112 is clocked. Upon a clocking, signal ENB1 goes logic low, ENB2 remains logic low, and ENB3 goes to a logic high state. After a period of delay caused by the delay element 14, the delay element 14, which is an inverting delay element in this embodiment, causes delayed signal 22 to go to a logic low state after a delay period caused by the delay element 14.

The high to low transition of the delayed signal 22, inverted by inverter 104, causes one shot 106C to transmit a pulse to AND-gate 108C. Because signal ENB3 is logic high, pulse emitted from one shot 106C causes the output of AND-gate 108C to go logic high thereby resetting the SR flip-flop 102 and causing output signal 26 to go from a logic high level to a logic low level. On the transition of output signal 26 from logic high to logic low, state machine 112 is again clocked this time causing signal ENB3 to go from logic high to logic low, signal ENB2 to go from logic low to logic high, and causing signal ENB1 to remain logic low.

After the output signal 26 which transitions from high to low level is delayed through delay element 14, delayed signal 22 will go logic high after the delay magnitude. At this point, the transition of delayed signal 22 from logic low to logic high level will cause one shot 106B to operate. The one shot 106B emitting a pulse which causes the output of AND-gate 108B to go logic high causing therefore the output of OR-gate 110 to go logic high thereby causing the SR flip-flop 102 to be set to a logic high level. Thus, in this state the output signal 26 transitions from a logic low to a logic high level. On the transition of output signal 26 from logic low to logic high, state machine 112 is again clocked. This clock causes signal ENB2 to go logic low, ENB3 to transition from logic low to logic high, and ENB1 to remain logic low.

After the output signal 26 transitions from logic low to logic high and is delayed through delay element 14, delayed signal 22 transitions from logic high to logic low, causing output of inverter 104 to transition to logic high thereby causing one shot 106C to operate. When one shot 106C operates, a pulse is emitted from one shot 106C causing the output of AND-gate 108C to go from a logic low to a logic high, thereby resetting the output of SR flip-flop 102 to a logic low. Thus, the output signal 26 transitions from a logic high to a logic low. With the transition of output signal 26, state machine 112 proceeds to a next state wherein signal ENB1 is logic high while ENB2 and ENB3 are logic low. This transition corresponds to a transition from the second time interval to the first time interval.

After delay of the output signal by the delay element 14, the next transition of delayed signal 22 will not affect the state of the shift SR register 102. With signal ENB1 logic high, the next receipt of reference signal 18 causes a set of the SR flip-flop 102. Thus, a complete operation of the phase locked frequency multiplier circuit 100 has been described for a 2× multiplication of the reference signal 18. This operation produces an output signal 26 having twice the frequency of the reference signal 18. Variations in the operation of state machine 112 and the delay of delay element 14 cause the circuit 100 to produce an output signal 26 at differing frequency multiples of the reference signal 18. However, the designer of the frequency multiplier 100 designs the frequency multiplier knowing a desired operational frequency of the reference signal 18 and desired multiplication ratios. With this knowledge, the designer designs the state machine 112 and delay element 14 to produce desired multiplication ratios and operating frequencies.

The frequency multiplication circuit 100 may be employed in a system wherein the reference signal 18 is directly used to produce a clock signal provided to other components within the integrated circuit. In this application, the frequency multiplier circuit 100 produces a clock signal having a 50% duty cycle at the same frequency as the reference signal 18. Thus, the ability to provide a 50% duty cycle throughout the multiplied frequency of operation of the output signal 26 is an additional benefit provided by the present invention.

Figure 4:
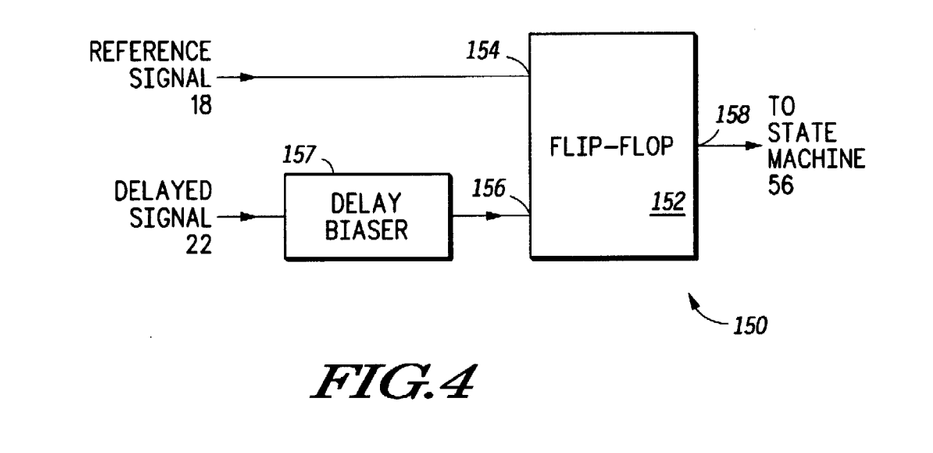
FIG. 4 illustrates, in block diagram form, an edge comparator in accordance with an embodiment of the present invention.

FIG. 4 illustrates an embodiment of the edge comparator 150 of the present invention. In this embodiment of the edge comparator 150, the edge comparator comprises a flip-flop 152 and a delay biaser 157. In one embodiment of the present invention, the flip-flop 152 comprises a D flip-flop. However, in other embodiments, the flip-flop 152 could comprise other types of logic as well. The flip-flop 152 has a first input 154, a second input 156, and an output 158 that provides input to the state machine 56. In operation, if reference signal 18 arrives at the first input 154 prior to the signal arriving at the second input 156, the output 158 will go to a first logic level. However, if the signal at the second input 156 arrives prior to the reference signal 18 at the first input 154, the output 158 goes to second logic level. Thus, the flip-flop 152 serves as an edge comparator for determining which signal arrives first at the flip-flop 152.

In the embodiment 150 illustrated in FIG. 4, the delayed signal 22 is received by a delay biaser 157 and biased by the delay biaser 157 before it is input at the second input of flip-flop 152. The delay biaser 157 delays receipt of the delayed signal 22 by the flip-flop 152 to cause the delay of the delay element to not exceed a delay limit. If the delay of the delay element 14 becomes too large, a last half cycle of a last cycle of a multiplied signal may be reduced so greatly as to cause problems in the operation of components being driven by output signal 22. Thus would most often be the case wherein the phase locked frequency multiplier circuit multiplied the reference signal 18 a number of times to produce the delayed signal 22. If the delay of the delay element 14 is larger than the delay limit, the last half of the last cycle prior to the reference signal 18 receipt may be very short, too short for normal operation of the system.

When flip-flop 152 receives a signal at its second input 156 prior to receiving a signal at its first input 154, it sends an increase delayed signal to the state machine 56 which in turn causes an increase in the delay of the delay element 14. Thus, by using the delay biaser 157 to delay slightly the delayed signal 22 prior to its receipt at the second input 156 of the flip-flop 152, the delay of the delay element 14 will not exceed a threshold which will cause problems in the output signal 26 that could effect additional elements driven by the output signal 26. Thus, the edge comparator and delay biaser 157 illustrated in FIG. 4 provides the further benefits of providing a digital circuit that will allow for the control of the output signal 26 to cause the output signal to be substantially in phase with the reference signal 18 as well as preventing the duty cycle problems previously described.

Figure 5:
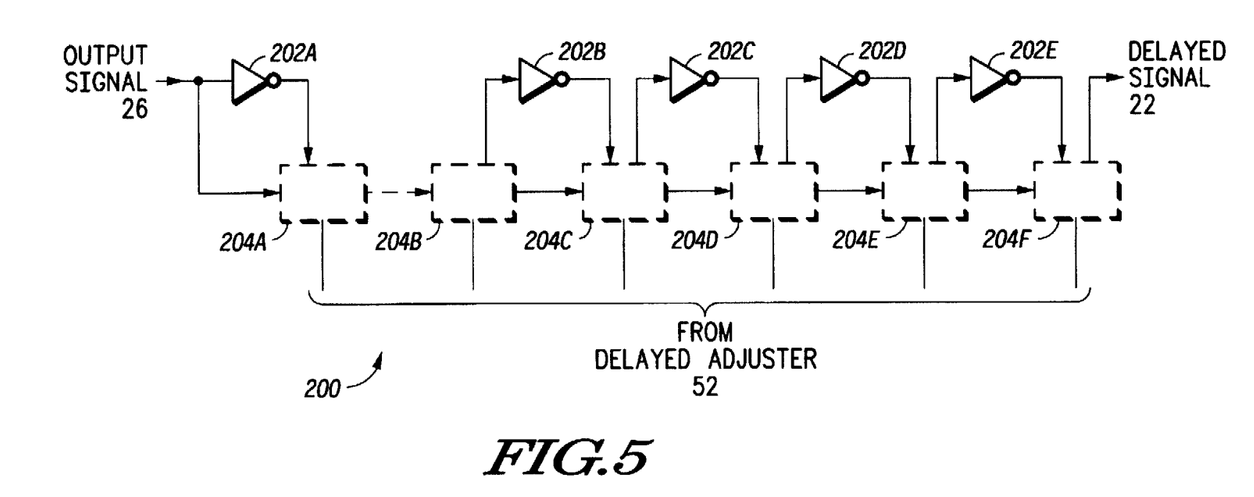
FIG. 5 illustrates in partial logic diagram form and partial block diagram form, an embodiment of a delay element in accordance with the present invention.

FIG. 5 illustrates an embodiment 200 of a delay element 14 of the present invention. The delay element 200 illustrated in FIG. 5 comprises a plurality of inverters 202 that are operably coupled with coupling elements 204 to produce a delayed signal 22 based upon the output signal 26. The coupling elements 204A through 204F receive a signal from a delay adjuster 52. Based upon the signal received, the coupling elements 204A through 204F selectively cause the inverters 202A through 202E to be contained within the circuit formed between the output signal 26 and the delayed signal 22. In one embodiment of the delay element 14 as illustrated in FIG. 5, each of the lines of input received from the delay adjuster 52 corresponds to a single coupling element 204. One particular implementation in that fashion could be to cause the coupling element to bypass a particular inverter 202 within the delay element. In another embodiment of the delay element 14 comprised of the plurality of inverters 202A through 202E, each of the control lines received from the delay adjuster 52 may control one or more than one inclusion of an inverter within the signal path from the output signal 26 to the delayed signal 22. For example, the five most significant control lines received from the delay adjuster 52 could each cause 8 inverters to be included within the signal path from the output signal 26 to the delayed signal 22. Other control lines from the delay adjuster 52 could cause 8 or fewer inverters to be introduced into the signal path between the output signal 26 and the delayed signal 22. Depending upon the particular application and whether the delay adjuster 52 will cause the magnitude of the delay element 14 to have great bandwidth, different control schemes may be employed. Thus, the embodiment 200 of the delay element 14 illustrated in FIG. 5 provides the important benefit of a digitally implemented delay that may be used in conjunction with the phase locked frequency multiplier circuit to accomplish the frequency multiplication function.

In other embodiments of the present invention, other types of digital elements may be used to accomplish delay as well. For example, other logic gates such as AND-gates and OR-gates as well as transistors connected in series could be used to accomplish individual delay magnitude functions. These elements could then be combined selectively to accomplish particular delay magnitudes for the delay element 14. Thus, the particular embodiment illustrated in FIG. 5 may be substituted for different individual digital circuit components that are known in the art and that otherwise may be developed in the future.

Figure 6:
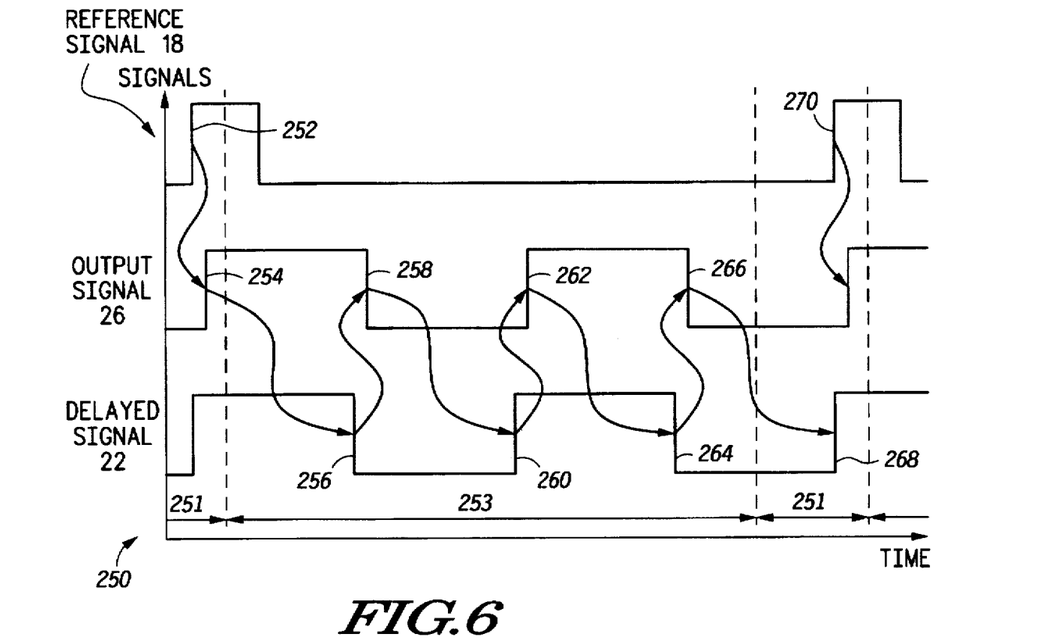
FIG. 6 illustrates a timing diagram the reference signal, the output signal, and the delayed signal of the frequency multiplier circuit of FIG. 2.

FIG. 6 is signal transition diagram 250 illustrating operation of the phase locked frequency multiplier circuit 100 of FIG. 3 during a 2× multiplication operation. As illustrated in FIG. 6, a first time interval 251 is mutually exclusive with a second time interval 253 such that they alternate over time. FIG. 6 illustrates a single operative cycle of the phase locked frequency multiplier circuit 100 of FIG. 3. However, the cycle will be repeated throughout the operation of the frequency multiplier circuit 100. The signal transition diagram is also representative of the digital frequency multiplier 10 of FIG. 1 and of the phase locked frequency multiplier circuit 50 of FIG. 2.

Upon the receipt of a rising edge 252 of reference signal 18, the receipt is made during the first time interval. Rising edge 252 causes output signal 26 to transition from low to high. Delayed signal 22 which had been previously logic low goes logic high at the transition. However, this transition was caused by a previous transition and delayed representation of output signal 26. The rising edge of the output signal 26 at transition 254 provided to the delay element 14 causes the delay element 14 to produce delayed signal 22 after the delay period. Since the delay element 14 in inverting an operation, after a delay period, the delayed signal 22 will go from a logic high to a logic low level.

The transition of output signal 26 at transition 254 causes a reset of the SR flip-flop 102 in the periodic interval selector 12 after a slight delay to cause the periodic interval selector to enter the second time interval 253. During the second time interval 253, the output signal 26 is a representation of the delayed signal 22. Thus, the transition of delayed signal 22 from high to low at transition 256 causes the output signal 26 to transition at point 258. Inherent set and reset delay in the period interval selector 12 are illustrated in FIG. 6 as time intervals between signal transitions. These delays are those associated with the operation time of the logic gates used to implement the circuit.

Next, after transition 258 of output signal 26 and after delay of delay element 14, the delay element 14 causes a transition from low to high of the delayed signal 22 at transition 260. Transition of delayed signal 22 at transition 260 after inherent delay in period interval selector 12 causes output signal 26 to go from a low logic level to a high logic level at transition point 262. At the next cycle inversion and delay of the output signal 26 by the delay element 14, the delayed signal 22 transitions from logic high level to logic low level at transition 264. After the inherent delay associated with the period interval selector 12, output signal 26 transitions from a logic high level to a logic low level at transition point 266.

Transition 266 of the output signal 26 from the logic high level to logic low level causes the periodic interval selector 12 to transition from the second time interval 253 back to first time interval 251. During the first time interval, further transitions in the delayed signal 22 will not cause transitions of the output signal 26. However, a transition of the reference signal 18 from low to high at transition point 270 causes output signal 26 to go from a low logic level to a high logic level after the inherent delay period at transition 268. In the embodiment of FIG. 6, the transition 268 of the output signal 26 causes the periodic interval selector to transition from the first time interval 251 again to the second time interval 253. Thus, FIG. 6 has illustrated a complete operation of the apparatus of the present invention for a 2× multiplication.

Figure 7:
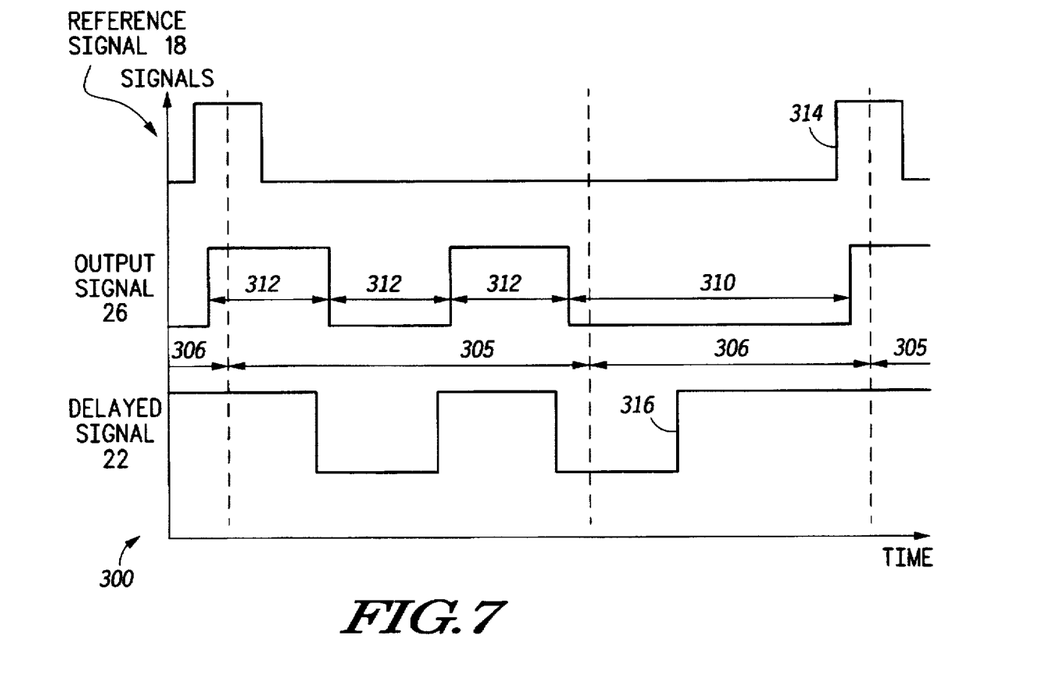
FIG. 7 illustrates a timing diagram of the reference signal, the output signal, and the delayed signal during a first operation of the frequency multiplier circuit of FIG. 2.

FIG. 7 illustrates an operation of the phase locked frequency multiplier circuit of the present invention in a mode wherein the delay interval 312 is too short. Note that the signal transitions as illustrated in FIGS. 7–9 sequence as they had in FIG. 6.

In the signal transition diagram 300 of FIG. 7, half cycles 312 of the output signal 26 during the second time interval 305 are substantially shorter than a half cycle 310 during the first time interval 306. Thus FIG. 7 illustrates an operation wherein the magnitude of the delay 312 associated with delay element 14 has not been adjusted to its proper duration. In fact, as illustrated in FIG. 7, the magnitude of delay 312 is much less than the second half 310 of the last multiplied cycle of the output signal 26. In a steady state operation of the multiplication circuitry of the present invention, each half cycle of the output signal 26 should have an equal duration so that the rising edges of the output signal 26 are significantly in phase with a theoretically correct frequency multiplied representation of the reference signal 18. As illustrated in FIG. 7 however, the first three half cycles of the output signal 26 have durations that are substantially less than the fourth half cycle of the output signal 26. Thus, the intermediate transitions of the output signal 26 are not in phase with a theoretically correct frequency multiplied representation of the reference signal 18.

To correct the operation of FIG. 7, the phase locked frequency multiplier circuit of the present invention would increase the delay associated with the delay element 14 to increase the duration of the first three half cycles of the output signal 26 in an attempt to equalize these half cycle durations 312 with the fourth half cycle duration 310 as illustrated in FIG. 7. The delay adjuster compares edges 314 and 316 to determine whether the delay produced by the delay element causing the half cycle durations 312 is too short.

Figure 8:
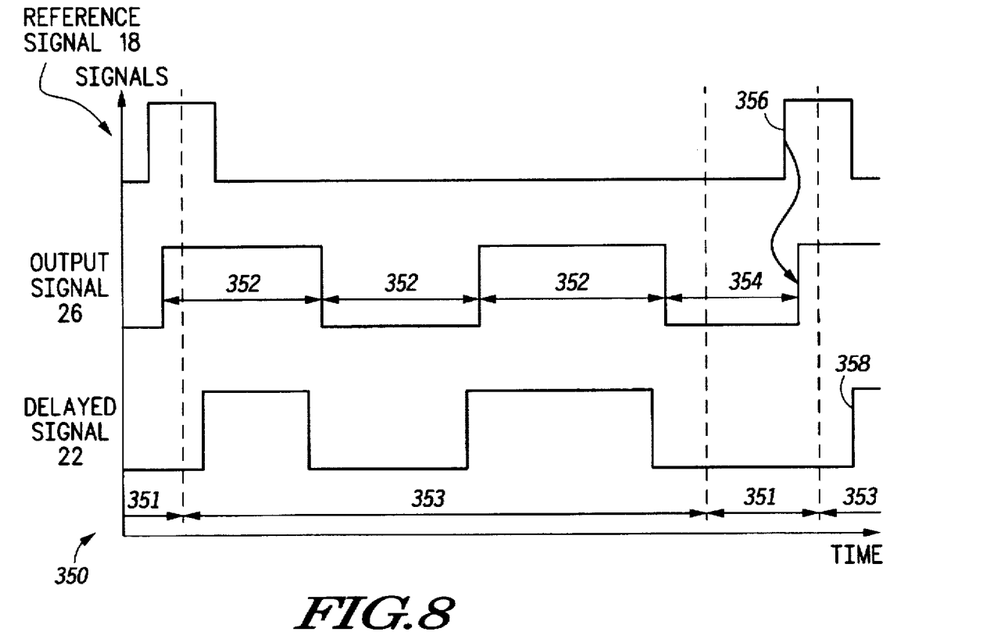
FIG. 8 illustrates a timing diagram of the reference signal, the output signal, and the delayed signal during a second operation of the frequency multiplier circuit of FIG. 2.
Figure 9:
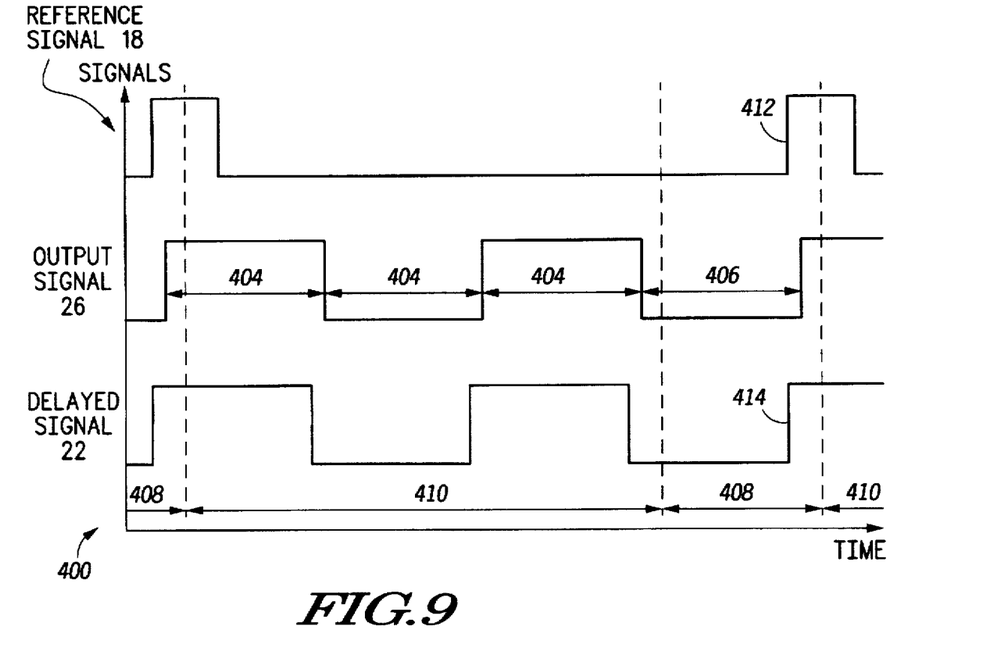
FIG. 9 illustrates a timing diagram of the reference signal, the output signal, and the delayed signal during a substantially steady state operation of the frequency multiplier circuit of FIG. 2.

FIG. 8 is signal timing diagram 350 illustrating a condition of operation wherein the delay magnitude 352 of the delay element 14 is too great. In this situation, the reference signal 18 correctly produces a first rising edge of the output signal 26 during a first time interval 351. However, the duration 352 of the output signal 26, corresponding to delay magnitude of delay element 14 is too large and resultantly the second half 354 of the last cycle of the output signal 26 prior to a next leading edge of the reference signal 18 is shorter in duration than the first three half cycles of the output signal 26. In this situation, if the duration 354 is too short with respect to the duration of 352, circuitry being driven by the output signal 26 may fail to operate properly during the last cycle of the output signal 26 prior to receipt of a next leading edge of the reference signal 18. Thus, the particular operation illustrated in the signal transition diagram 350 of FIG. 8 should be avoided when possible.

The present invention, including the delay biaser 154 illustrated in FIG. 4, prevents the magnitude of the delay element 14 from exceeding a limit. By dissecting the duty cycle and the half cycle durations of the output signal 26, this delay limit may be established. Based upon this desired delay limit, the delay biaser 154 may be selected so as to achieve a desired duration 354 of the last half of the last cycle of the output 26 prior to the receipt of a rising edge of the reference signal 18. The delay adjuster in conjunction with the delay biaser accomplishes the duty cycle adjustments by comparing rising edge 356 of the reference signal 18 to rising edge 358 of the delayed signal 22 and adjusting delay duration accordingly. Thus, the present invention has included a technique for avoiding the duty cycle problems that would otherwise be present in the operation of a PLL.

FIG. 9 is a signal timing diagram 400 showing signals representative of those produced by the multiplier circuit of the present invention during a steady state operation. In this particular study state operation, the output signal 26 is oscillates at a multiplied frequency of the reference signal 18 and has a substantially 50% duty cycle. In this fashion, the duration 404 of the first three half cycles of the output signal 26 is substantially equal to the duration 406 of the last half cycle of output signal 26 prior to the receipt of the rising edge of reference signal 18. In this situation, the first time interval 408 is approximately one third as long as the second time interval 410. Such is the case since the first time interval and second time interval 408 and 410 are dependent upon the output signal 26. As illustrated, the delay adjuster and delay biaser have adjusted the delay of delay element such that rising edge 412 of reference signal 18 transitions at substantially the same time as rising edge 414 of delayed signal 22. At this adjustment level, output signal 26 has the substantially 50% duty cycle at a constant output frequency.

Figures 10, 11:
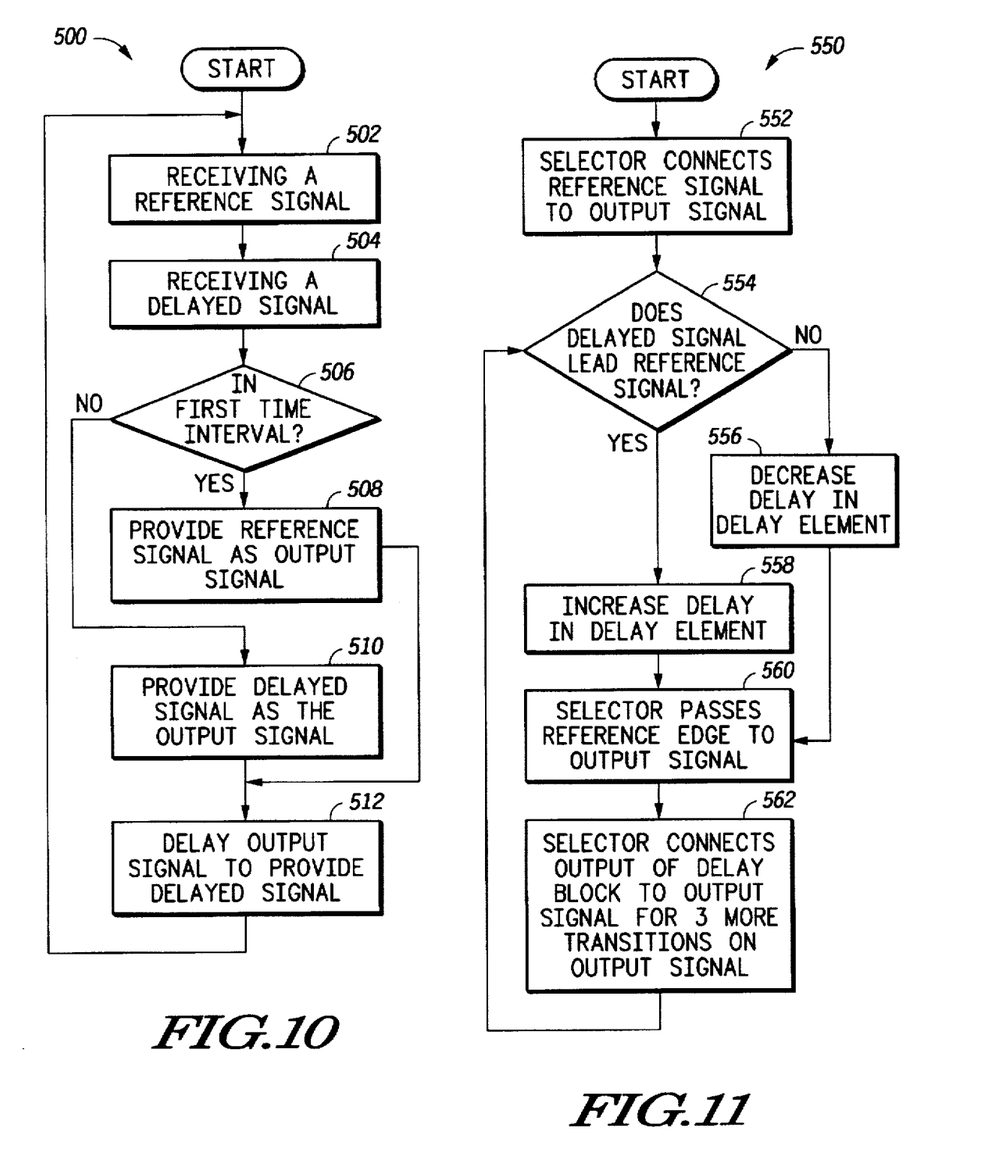
FIG. 10 illustrates, in flow chart form, a method of operation in accordance with the present invention.
FIG. 11 illustrates, in flow chart form, a method for adjusting a delay element of the present invention.

FIG. 10 illustrates an embodiment of an operation of the circuitry of the present invention and also a method of generating a phase locked multiple frequency output signal based upon a reference signal in accordance with the present invention. The method 500 commences as step 502 of receiving a reference signal of which a multiple frequency representation is desired. From step 502 the method proceeds to step 504 of receiving a delayed signal. The delayed signal in step 504 is similar to or equivalent to the delayed signals previously described in accordance with description of the apparatus of the present invention.

From step 504 the method proceeds to step 506 of determining whether the operation is in the first time interval. From step 506 if it is determined that operation is in the first time interval, the method proceeds to step 508, wherein a reference signal is provided as the output signal. However, as has been previously discussed, a representation of the reference signal may be supplied as the output signal instead of strictly the reference signal. If at step 506 it is determined that the operation is not in the first time interval, the method proceeds to step 510 wherein a representation of the delayed signal is provided as the output signal. The representation may either be the delayed signal itself or a variation of the delayed signal, depending upon the application. As was discussed with respect to FIG. 3, the representation may be achieved through the use of a flip-flop or other digital circuitry. From both steps 508 and 510, the method proceeds to step 512 of delaying the output signal to produce a delayed signal. In one embodiment, delay is introduced through use of a delay element such as the delay element previously described. However, other delay techniques could also be employed. From step 512, the method proceeds again to step 502 wherein the steps are repeated for continued operation. Thus, the method 500 of FIG. 10 provides the same important benefits as those previously discussed with respect to the digital frequency multiplier of the present invention.

FIG. 11 illustrates a method for adjusting delay magnitude of one or more of the delay elements of the present invention. As has been previously described, adjusting the magnitude of the delay produced by the delay element in conjunction with altering the first and second time intervals may change the frequency multiplication ratio. Adjustment of delay elements alone adjusts the phase and duty cycle of the output of the frequency multiplier.

The method 550 commences to step 552 of connecting first reference signal to the output signal. As has been previously described, a selector may simply connect a representation of the reference signal to the output signal instead of directly connecting the signals. From step 552 the method proceeds to step 554 of determining whether the delayed signal led the reference signal on a previous receipt of the reference signal. Representations of the particular signals may be considered instead of the actual signals themselves as has been previously discussed with reference to the figures. If at step 554 it is determined that the delayed signal does lead the reference signal, the method proceeds to step 558 wherein the delay of the delay element increases. An increase in delay may be accomplished by increasing the number of individual delay elements within the delay path associated with delay element 14 or another fashion as well.

However, if at step 554 it is determined that the delayed signal does not lead the reference signal, the method proceeds to step 556 wherein the delay of the delay element is decreased. At step 556 a decrease in delay may be accomplished by removing delay elements from a delay path. From both steps 556 and 558 the method proceeds to step 560 wherein the selector passes the reference signal edge to the output signal. However, the selector could also pass a representation of the reference edge to the output signal to cause the output signal to have particular characteristics. From step 560 the method proceeds to step 562 of connecting the output of the delay block to the output signal for three more transitions of the output signal. The embodiment of step 562 illustrated corresponds to operation during the second time interval as has been previously defined for a 2× multiplication of the multiplication circuit. Of course, step 562 forces operation in the second time interval for differing numbers of transitions of the output signal depending upon a desired multiplication ratio. For example, in a 10× multiplication circuit, step 562 causes the circuit to remain in the second time interval for 19 transitions of the output signal. Once step 562 is complete, the method 550 returns to step 554 wherein operation in the first time interval resumes. Thus, the steps illustrated in FIG. 11 provide a mechanism for adjusting the delay associated with the delay element 14 of the present invention to cause the output signal to provide an in phase representation of the input signal at a frequency multiple of the reference signal.

While the invention has been described in the context of a preferred embodiment, it will be apparent to those skilled in the art that the present invention may be modified in numerous ways and may assume many embodiments other than that specifically set out and described above. For example, in the illustrated embodiment, the present invention is implemented in hardware. However, in other embodiments, the present invention can be implemented in software, or a combination of hardware and software. Accordingly, it is intended by the appended claims to cover all modifications of the invention which fall within the true spirit and scope of the invention.

What is claimed is:

1. A digital frequency multiplier, comprising:

a periodic interval selector having a reference signal input for receiving a reference signal, a delayed signal input, and a periodic interval selector output; and a delay element having an input connected to the periodic interval selector output and a delayed signal output connected to the delayed signal input, the delay element comprising an adjustable plurality of logic gates operably connected to produce an adjustable delayed output signal at the delayed signal output with respect to a periodic interval selector output signal at the input of the delay element.

2. The digital frequency multiplier of claim 1, wherein:

the periodic interval selector further comprises circuitry for producing the periodic interval selector output signal that is based upon the reference signal during a first time interval and that is based upon the adjustable delayed output signal during a second time interval; and the delay element comprises further circuitry for producing the adjustable delayed output signal, wherein the adjustable delayed output signal is a delayed representation of the periodic interval selector output signal.

3. The digital frequency multiplier of claim 2, wherein the delay element further comprises a delay magnitude input, and the digital frequency multiplier further comprises:

a delay adjuster having a first input connected to the reference signal input, a second input connected to the delayed signal input, and a delay adjuster output connected to the delay magnitude input of the delay element, wherein a delay produced by the delay element is based upon the delay adjuster output.

4. The digital frequency multiplier of claim 3, wherein the delay adjuster comprises:

an edge comparator having a first input as the reference signal input, a second input as the delayed signal input, and an output; and a state machine having an input connected to the output of the edge comparator and an output as the delay adjuster output.

5. The digital frequency multiplier of claim 4, wherein the edge comparator comprises a flip-flop having the delayed signal input as a first input and the reference signal input as a second input; and the state machine comprises a counter having an input connected to the output of the edge comparator, a clock input, and a counter output as the delay adjuster output.

6. The digital frequency multiplier of claim 3, wherein the delay adjuster further comprises:

a delay biaser, wherein the delay biaser limits the delay produced by the delay element to be below a delay threshold level.

7. The digital frequency multiplier of claim 2, wherein:

the first time interval comprises an interval corresponding to a transition of the reference signal present at the reference signal input; and the second time interval comprises an interval mutually exclusive with the first time interval.

8. The digital frequency multiplier of claim 2, wherein the first time interval comprises an interval that encompasses a transition of the reference signal present at the reference signal input and an adjacent transition of the adjustable delayed output signal at the delayed signal input.

9. The digital frequency multiplier of claim 1, wherein a respective frequency of an output signal at the periodic interval selector output comprises an integer multiple of a respective frequency of the reference signal present at the reference signal input of the periodic interval selector.

10. A phase-locked frequency multiplier circuit comprising:

a periodic interval selector, wherein the periodic interval selector receives a reference signal and a delayed signal, and wherein the periodic interval selector produces an output signal based upon the reference signal during a first time interval and based upon the delayed signal during a second time interval;

a delay element operably coupled to the periodic interval selector, wherein the delay element receives the output signal and produces the delayed signal, wherein the delayed signal is a delayed representation of the output signal; and a delay adjuster operably coupled to the delay element, wherein the delay adjuster receives the reference signal and the delayed signal, and wherein the delay adjuster adjusts a delay of the delay element based upon the reference signal and the delayed signal to cause the output signal to be at a multiple frequency of the reference signal.

11. The phase-locked frequency multiplier circuit of claim 10, wherein the delay adjuster comprises:

an edge comparator having a first comparator input receiving the reference signal, a second comparator input receiving the delayed signal, and a comparator output producing a delay increase signal when the delayed signal arrives prior to the reference signal and a delay decrease signal when the reference signal arrives prior to the delayed signal; and a state machine operably coupled to the edge comparator, wherein the state machine receives the delay increase signal and the delay decrease signal, and wherein an output of the state machine represents a delay to be produced by the delay element.

12. The phase-locked frequency multiplier circuit of claim 11, wherein the state machine comprises:

a counter operably coupled to the edge comparator, wherein the counter receives the delay increase signal as a count-up signal and the delay decrease signal as a count-down signal, and wherein an output of the counter represents a delay to be produced by the delay element.

13. The phase-locked frequency multiplier circuit of claim 11, wherein the delay adjuster further comprises:

a delay biaser operably coupled to the edge comparator, wherein the delay biaser delays receipt of the delayed signal by the edge comparator to cause the delay of the delay element to not exceed a delay limit.

14. The phase-locked frequency multiplier circuit of claim 10, wherein a respective frequency of the output signal is an integer multiple of a respective frequency of the reference signal.

15. The phase-locked frequency multiplier of claim 10, wherein the delay element comprises an adjustable plurality of logic gates operably connected to produce an adjustable delay.

16. A method of generating a phase-locked multiple frequency output signal based upon a reference signal comprising the steps of:

receiving the reference signal;

providing a representation of the reference signal as an output signal during a first time interval;

providing a representation of a delayed signal as the output signal during a second time interval; and selectively delaying the output signal to produce the delayed signal; and adjusting a delay of the delayed signal based upon the reference signal and the delayed signal to cause the output signal to be at a multiple frequency of the reference signal.

17. The method of claim 16, further comprising the step of:

biasing a delay of a delay interval between the output signal and the delayed signal to meet interval constraints of the output signal.

* * * * *